US011721779B2

(12) United States Patent
Hezar et al.

(10) Patent No.: US 11,721,779 B2
(45) Date of Patent: Aug. 8, 2023

(54) PHOTODETECTOR AND OPTICAL SENSING SYSTEM

(71) Applicant: TEXAS INSTRUMENTS INCORPORATED, Dallas, TX (US)

(72) Inventors: Rahmi Hezar, Allen, TX (US); Henry Litzmann Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/246,068

(22) Filed: Apr. 30, 2021

(65) Prior Publication Data

US 2022/0352406 A1  Nov. 3, 2022

(51) Int. Cl.
*H01L 31/107* (2006.01)
*H01L 31/109* (2006.01)
*H01L 31/02* (2006.01)

(52) U.S. Cl.
CPC ...... *H01L 31/107* (2013.01); *H01L 31/02027* (2013.01); *H01L 31/109* (2013.01)

(58) Field of Classification Search
CPC ............. H01L 31/107; H01L 31/02027; H01L 31/109; H01L 31/02327; H01L 31/02325; H01L 29/66159; H01L 29/864; H01L 29/66113
See application file for complete search history.

(56) References Cited

U.S. PATENT DOCUMENTS

| 9,461,046 | B1 | 10/2016 | Edwards et al. |
| 9,818,795 | B2 | 11/2017 | Debord et al. |
| 2009/0184317 | A1* | 7/2009 | Sanfilippo ......... H01L 27/14658 257/E31.116 |
| 2020/0006549 | A1 | 1/2020 | Sadovnikov et al. |
| 2020/0212854 | A1 | 7/2020 | Seyed Aliroteh et al. |
| 2022/0149098 | A1* | 5/2022 | Wang ................ H01L 27/14627 |

FOREIGN PATENT DOCUMENTS

CA  832194 A  1/1970

* cited by examiner

*Primary Examiner* — Calvin Y Choi
(74) *Attorney, Agent, or Firm* — Andrew R. Ralston; Frank D. Cimino

(57) ABSTRACT

An integrated circuit includes a photodetector that has an epitaxial layer with a first conductivity type located over a substrate. A buried layer of the first conductivity type is located within the epitaxial layer and has a higher carrier concentration than the epitaxial layer. A semiconductor layer located over the buried layer has an opposite second conductivity type and includes a first sublayer over the buried semiconductor layer and a second sublayer between the first sublayer and the buried layer. The first sublayer has a larger lateral dimension than the second sublayer, and has a lower carrier concentration than the second sublayer.

20 Claims, 10 Drawing Sheets

PHOTODETECTOR AND OPTICAL SENSING SYSTEM

BACKGROUND

Photodetectors are used in many applications. Photodetectors detect light and generate electrical signals according to the detected light. A photodetector, such as an avalanche photodiode, includes a p-n junction. When the photodetector is under a bias voltage, a current flows though the p-n junction in response to detected light.

SUMMARY

The inventors disclose various methods and devices that may be beneficially applied to light detection in integrated circuits (ICs), for example avalanche photodiodes. While such embodiments may be expected to provide improvements in performance, such as reduced signal noise, no particular result is a requirement of the present invention unless explicitly recited in a particular claim.

In one example, an integrated circuit includes a photodetector that has an epitaxial layer with a first conductivity type located over a substrate. A buried layer of the first conductivity type is located within the epitaxial layer and has a higher carrier concentration than the epitaxial layer. A semiconductor layer located over the buried layer has an opposite second conductivity type and includes a first sublayer over the buried first semiconductor layer and a second sublayer between the first sublayer and the buried layer. The first sublayer has a larger lateral dimension than the first sublayer in a direction parallel to a top surface of the epitaxial layer, and has a lower carrier concentration than the second sublayer.

Another example includes an optical sensing system that includes an integrated circuit such as previously described. A lens is configured to focus an optical signal over the photodetector. A processing module coupled to the photodetector is configured to perform post-acquisition processing of the optical signal, the post-acquisition processing including determining a point in space of an object from which the optical signal emanates.

Other examples include methods of manufacturing the IC and/or the optical sensing system.

BRIEF DESCRIPTION OF THE DRAWINGS

For a detailed description of various examples, reference will now be made to the accompanying drawings in which.

DETAILED DESCRIPTION

Optical sensing applications, such as light-detection-and-ranging (LiDAR) systems that operate in limited radiant powers over long distances, require current gain from the photodiode that can't be obtained from amplifier circuits without an unacceptable higher noise penalty. This current gain may be created by biasing the diode with a high voltage that is slightly below the breakdown point of the diode PN junction, producing a depletion region. The high electric field created with high voltage in the depletion region results in an avalanche current with gain, and higher bias voltages may produce higher gain. Edge breakdown is a premature breakdown of the semiconductor material in which the photodiode is formed, and may occur when the electric field at the edge of the depletion region exceeds the breakdown strength of the semiconductor. Edge breakdown may lead to higher signal noise due to thermally generated avalanche, and lower breakdown voltage and gain for the entire diode.

The present disclosure is directed to avalanche photodiodes (APDs) with reduced edge breakdown and reduced noise related to such breakdown. Such diodes may beneficially employed in optical sensing systems with improved signal-to-noise parameters. While such embodiments may be expected to provide improvements relative to conventional APDs, no particular result is a requirement of the present invention unless explicitly recited in a particular claim.

The described examples include a photodetector and a method of forming the photodetector. The illustrative photodetector includes an epitaxial layer having a first conductivity type and a top surface. A buried layer having the first conductivity type is located within the epitaxial layer. A semiconductor layer is located between the buried layer and the top surface and has a second opposite conductivity type, forming a p-n junction with the buried layer. The second semiconductor layer includes a first sublayer at the top surface, and a second sublayer between the first sublayer and the buried layer. Further, the first sublayer has a larger lateral dimension than the second sublayer in a direction parallel to the top surface, and has a greater doping level than the first sublayer. This configuration generally reduces or prevents edge breakdown at edges of the first semiconductor layer. The described examples also include an optical sensing system having a photodetector consistent with the present disclosure. The optical sensing system may be a light-detection-and-ranging (LiDAR) system.

Figure 6:
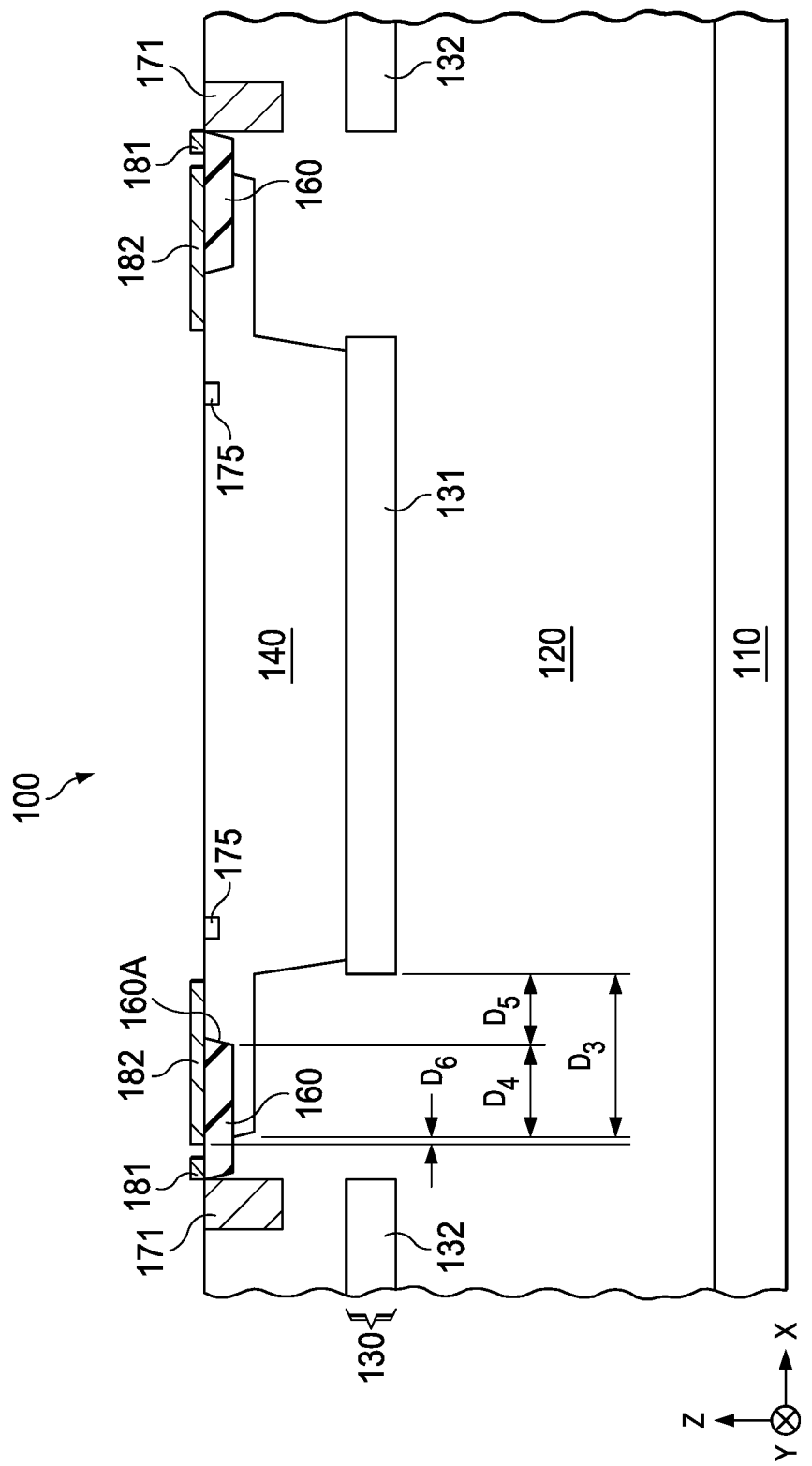
Figure 7:
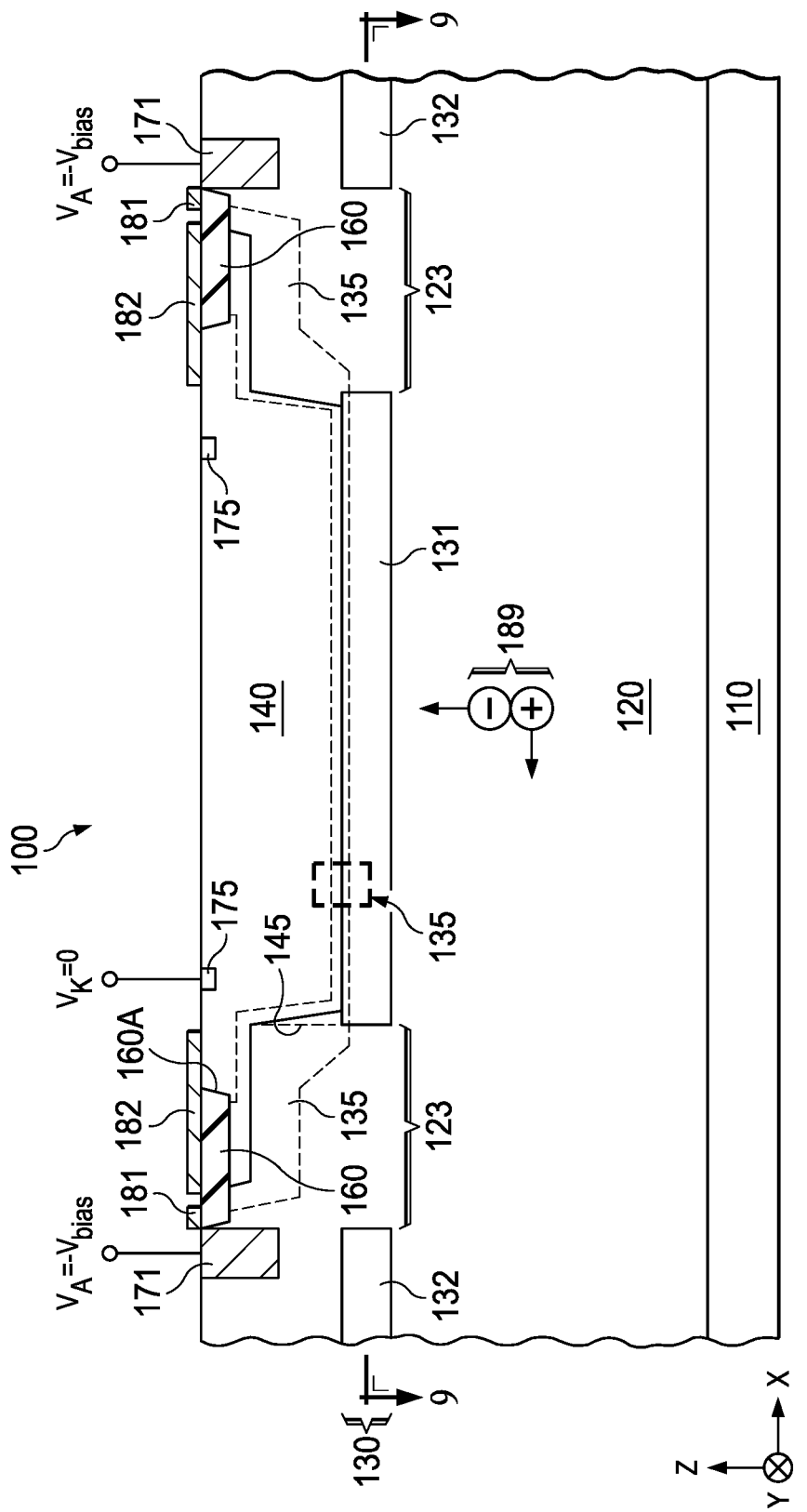
Figure 8:
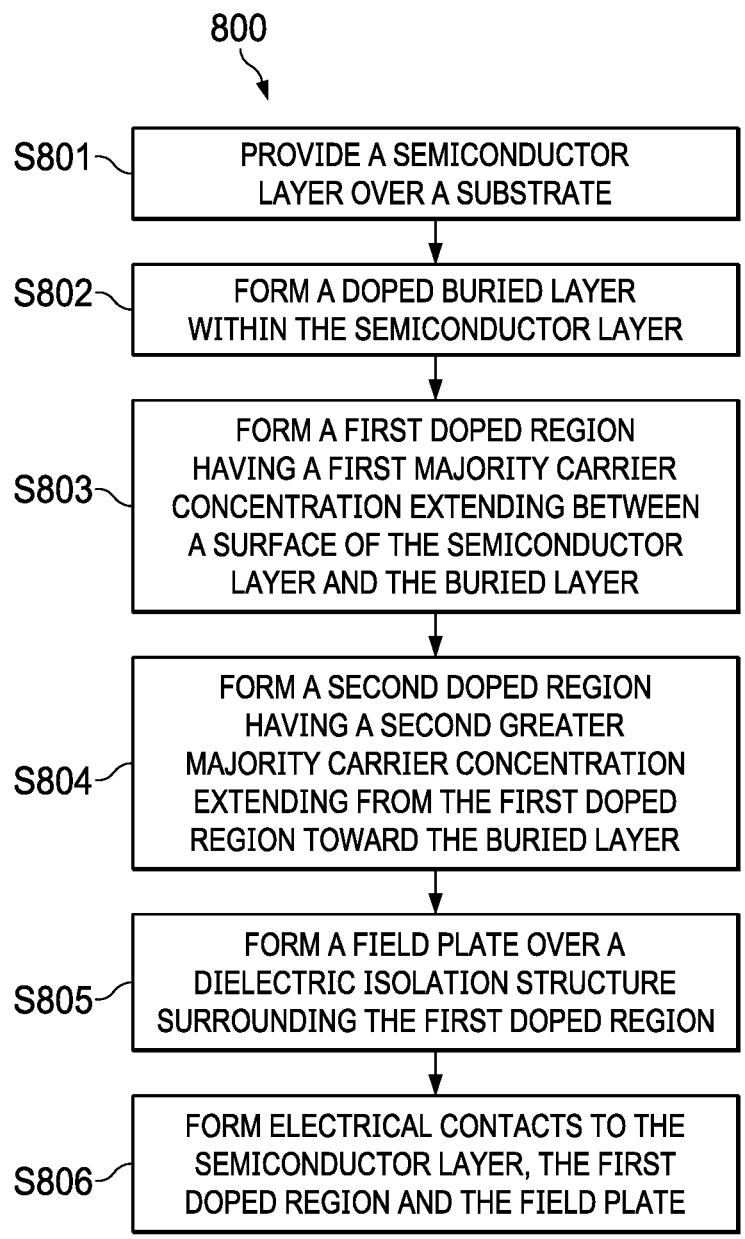
FIG. 8 illustrates a method for forming a photodetector according to described examples.

FIGS. 1-7 illustrate cross-sectional views of an example photodiode 100, e.g. an APD, at various stages of formation, and FIG. 8 illustrates an example method 800 for forming the photodetector 100. FIGS. 1-7 will now be described concurrently with the method 800. FIGS. 1-7 also include for reference a coordinate system comprising X, Y, and Z orthogonal axes. A direction parallel to the X-Y plane is defined as an "in-plane direction." The Z-axis is perpendicular to the X-Y plane and defines an "out-of-plane" direction.

Figure 1:
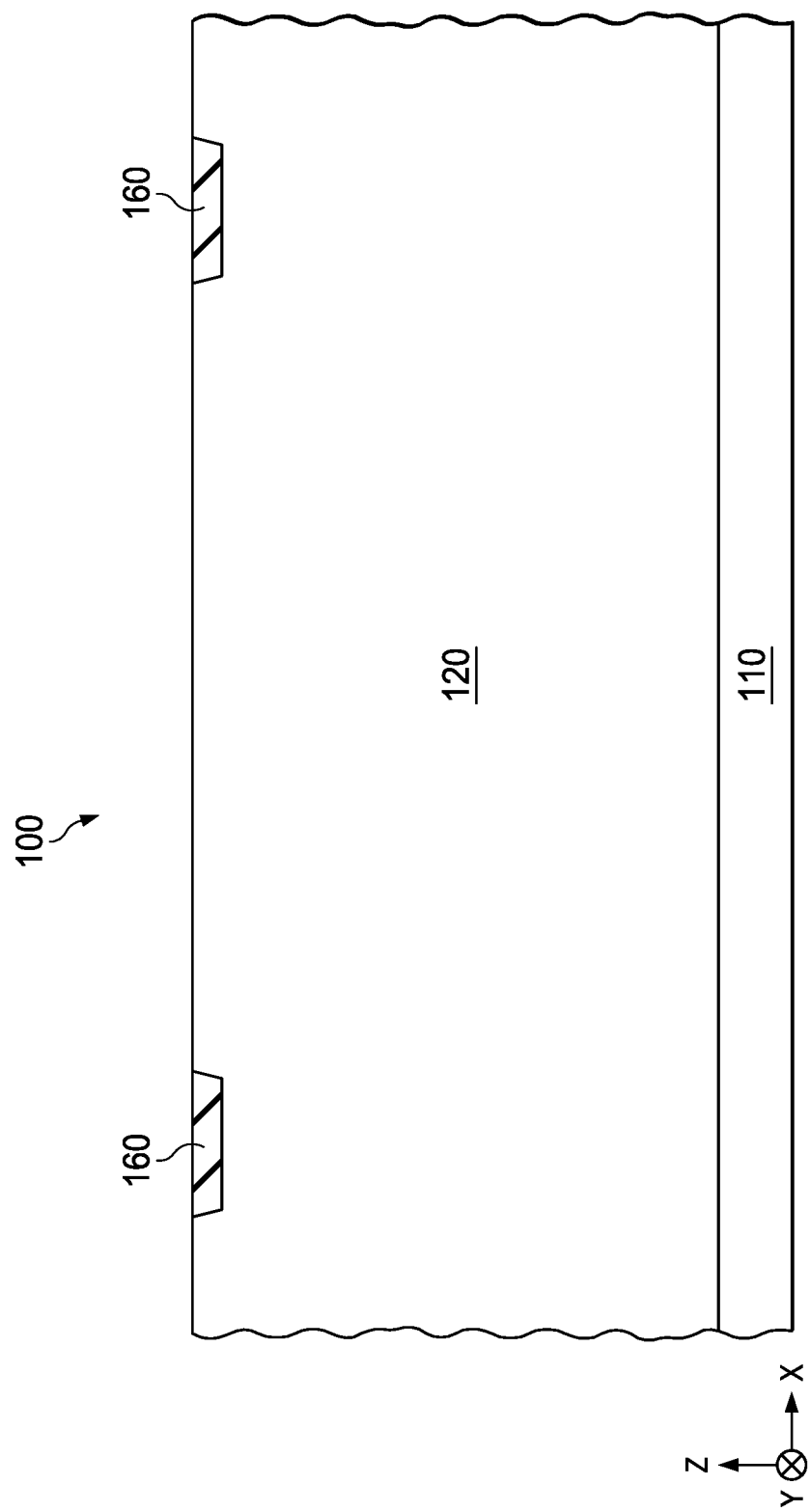
FIGS. 1 to 7 illustrate an example photodiode at various stages of forming a photodetector according to described examples.

FIG. 1 illustrates a photodiode 100 at an intermediate stage of formation. A semiconductor layer 120 lies over a substrate 110, which may be provided according to step S801 of method 800. In one example, the semiconductor layer 120 is or includes an epitaxial layer formed over the substrate 110, and may be or include a lightly doped p-type epitaxial layer. In some examples, the substrate 110 is a bulk support substrate, or handle wafer, that supports the semiconductor layer 120. The semiconductor layer 120 may be formed with desired qualities and properties such as a desired doping level by, e.g. in situ doping of the semiconductor layer 120 during epitaxial growth. The semiconductor layer 120 may primarily comprise silicon. The semiconductor layer 120 and the substrate 110 may optionally be of the same conductivity type, such as p-type or n-type. A p-type semiconductor is a semiconductor for which the majority carriers are holes, and an n-type semiconductor is a semiconductor for which the majority carriers are electrons.

Some or all of the following doping ranges may be chosen for the components of the photodiode 100 according to various application scenarios. A p-type semiconductor may have a P− doping level (lightly doped) that is at a doping level, or doping concentration, in a range of $10^{14}$ cm$^{-3}$ to $10^{16}$ cm$^{-3}$, a P doping level that is a doping level in a range of $10^{16}$ cm$^{-3}$ to $10^{18}$ cm$^{-3}$, a P+ doping level (heavily doped) that is in a range of $10^{18}$ cm$^{-3}$ to $10^{21}$ cm$^{-3}$, or any other suitable p-type doping level. An n-type semiconductor may have an N− doping level (lightly doped) that is a doping level in a range of $10^{14}$ cm$^{-3}$ to $10^{16}$ cm$^{-3}$, an N doping level in a range of $10^{16}$ cm$^{-3}$ to $10^{18}$ cm$^{-3}$, an N+ doping level (heavily doped) in a range of $10^{18}$ cm$^{-3}$ to $10^{21}$ cm$^{-3}$, or any other suitable n-type doping. In various examples the substrate 110 is a p-type silicon substrate, and the semiconductor layer 120 has a P− doping level.

Figure 9:
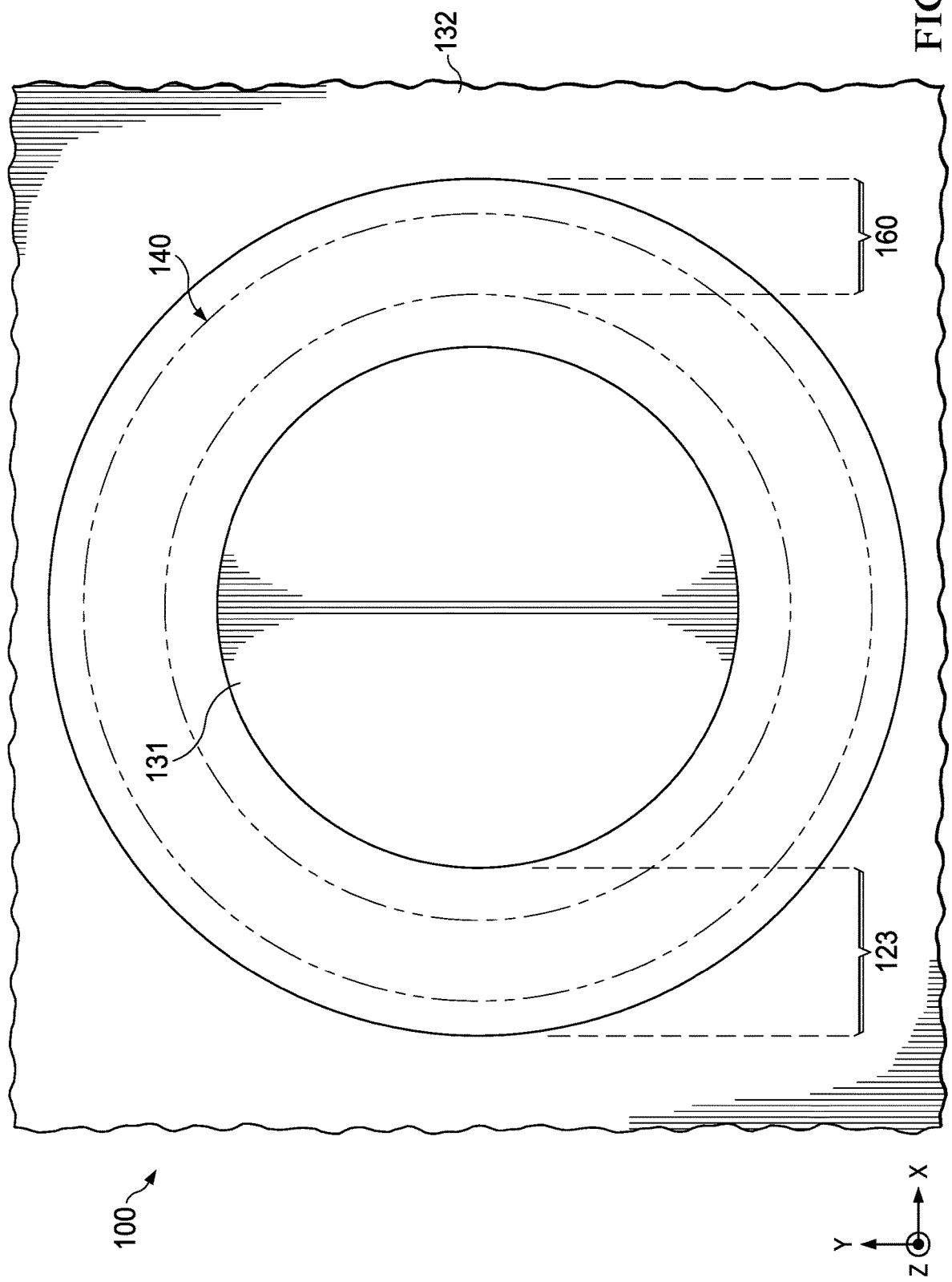
FIG. 9 illustrates a plan view of the photodetector shown in FIG. 7 according to described examples.

In FIG. 1 the partially formed photodiode 100 includes a dielectric isolation structure 160. Referring briefly to FIG. 9, the isolation structure 160 is seen in one example to be a closed loop, for example circular. The isolation structure 160 may be a shallow trench isolation (STI) region as illustrated, or may be a local oxidation of silicon (LOCOS) region in other examples not explicitly shown. The isolation structure 160 may be formed by any conventional or nonconventional process, and may optionally be formed at a later stage of manufacturing the photodiode 100.

Figure 2:
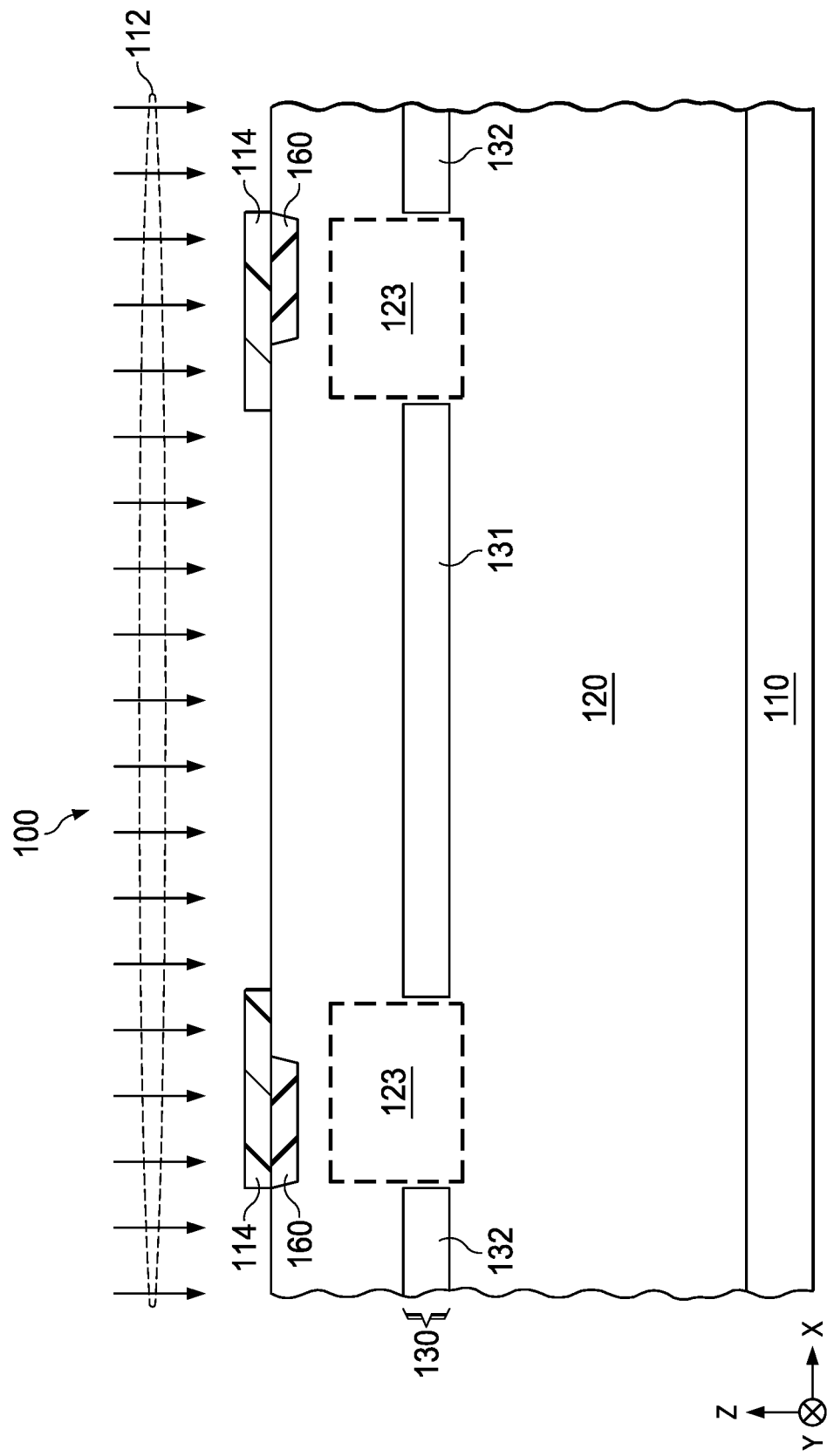

FIG. 2 illustrates the photodiode 100 during formation of a buried layer 130 in a step corresponding to step S802 in FIG. 8. Forming the buried layer 130 includes an implant process 112 that includes implanting, in the current example, a p-type dopant such as boron into the semiconductor layer 120 using a resist layer 114. In one example, the implant process 112 may implant boron with an energy in a range between 700 keV and 3 MeV, and a dose in a range between 5E11 cm$^{-2}$ and 7E13 cm$^{-2}$. The resist layer 114 is patterned such that a first portion 131 and a second portion 132 of the buried layer 130 results. In the example of FIG. 2, the first portion 131 of the buried layer 130 is laterally separated from the second portion 132 of the buried layer 130 by one or more separation portions 123 of the semiconductor layer 120. Similar to the isolation structure 160, the separation portions 123 as illustrated may be sections of a single separation portion that surrounds the first portion 131. The separation portions 123 can also be referred to as "blocking portions" or "blocking layers". In some examples, the buried layer 130 has a P+ doping level, e.g. is heavily doped.

The separation portions 123 have substantially the same doping level as the semiconductor layer 120. As the semiconductor layer 120 has a lower doping level than the buried layer 130, the separation portions 123 of the semiconductor layer 120 have a lower carrier concentration and are less conductive than the buried layer 130. In a step not shown the photoresist masks 114 are subsequently removed.

Figure 3:
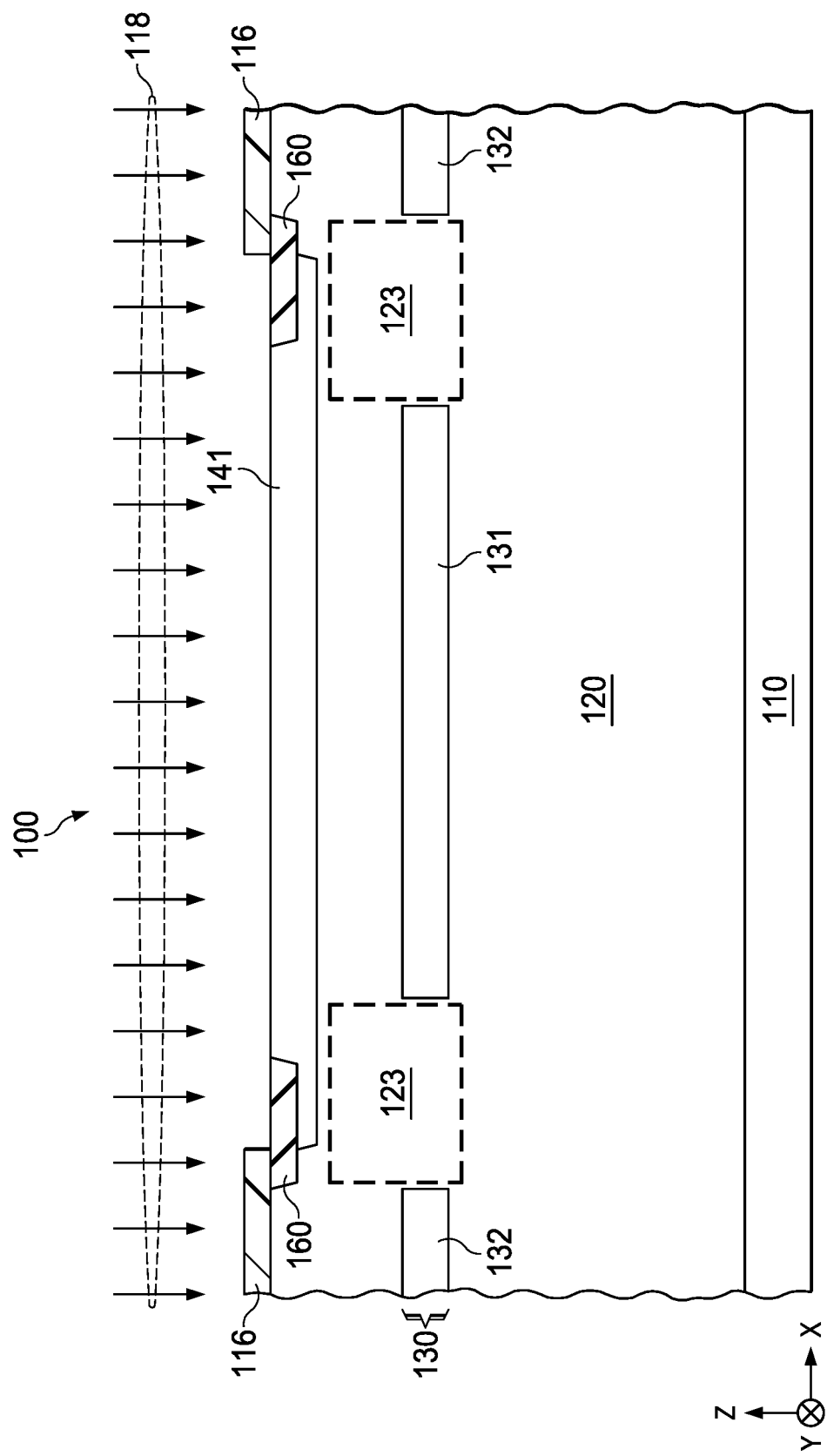

FIG. 3 illustrates a first step of forming an N-type sublayer 141 at the top surface of the semiconductor layer 120 that may act as a cathode of the photodiode 100, the step corresponding to S803 of FIG. 8. The sublayer 141 may be referred to as a first doped region 141 or a first cathode layer 141. At this stage of processing, a resist pattern 116 defines an opening through which an N-type dopant 118, e.g. phosphorous or arsenic, is implanted into the semiconductor layer 120 to form the first cathode layer 141. The implant process may be a process used to form an N-drift region of a MOS transistor in other device process flows, and may be a chain implant. At least one implant energy is great enough to implant the dopant below the isolation structure 160. In one example, phosphorous is implanted using one or more implant conditions, including implanting with an energy of in a range between 150 keV and 500 keV and a dose of in a range between about 1E12 cm$^{-2}$ and 8E12 cm$^{-2}$. The resulting dopant profile results in the first cathode layer 141 having a first carrier (electron) concentration and a maximum depth in a range between about 0.5 μm and about 1.0 μm. Ends of the first cathode layer 141 are located under one side of the isolation structure 160 and under the other side of the isolation structure 160. This placement also results in the ends of the first cathode layer 141 being located over corresponding separation portions 123. The photoresist masks 116 are removed after the implantation step. The dopant concentration below the isolation structure 160 is such that the first cathode layer 141 depletes during operation of the photodiode 100, similar to the RESURF condition in some MOS transistors. This condition may be provided by a dopant concentration in a range between about 2E12 cm$^{-2}$ and about 3E12 cm$^{-2}$.

Figure 4:
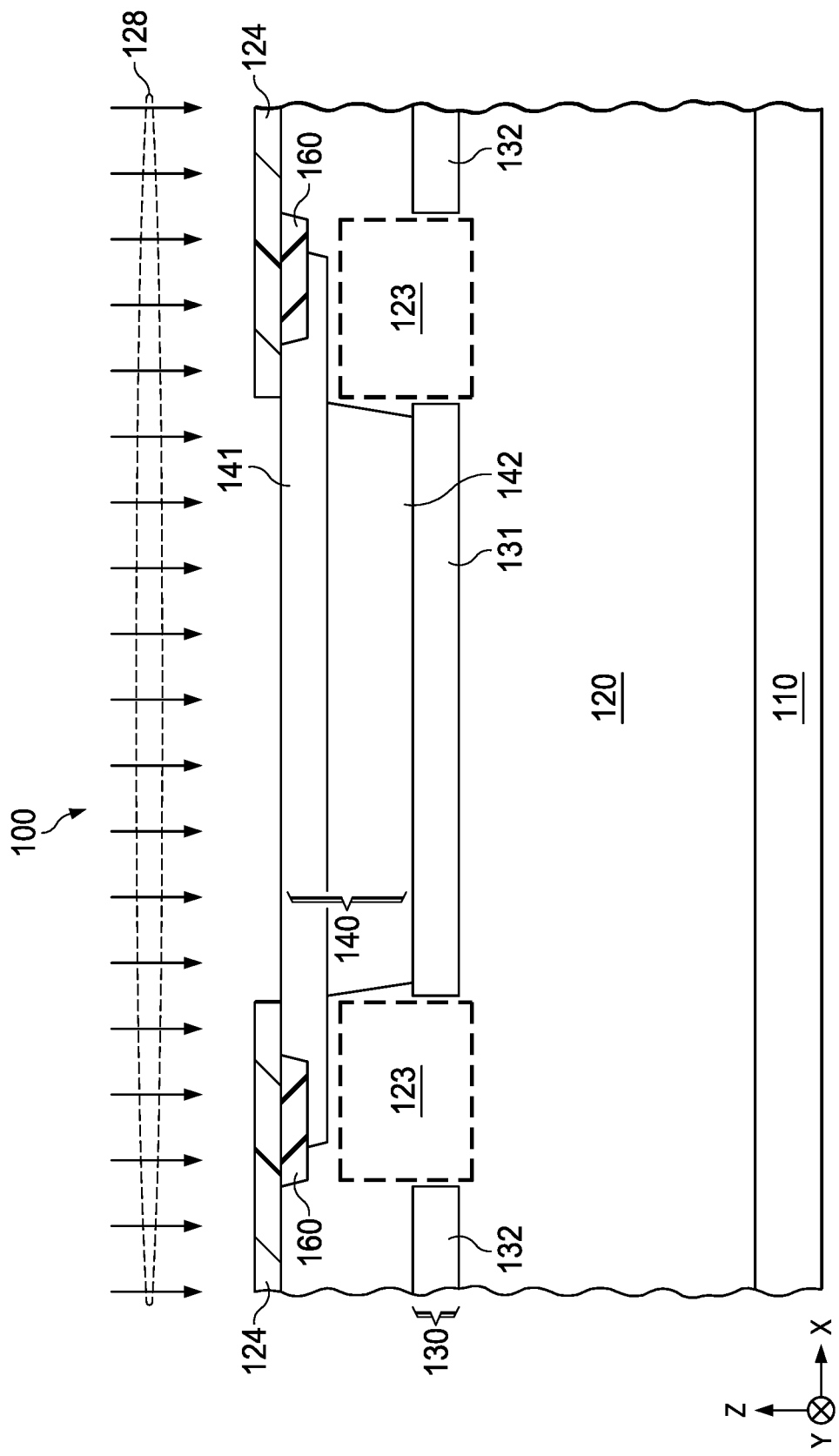

FIG. 4 illustrates a step of forming a second N-type sublayer 142 between the first cathode layer 141 and the first portion 131 of the buried layer 130, the step corresponding to S804 of FIG. 8. The sublayer 142 may be referred to as a second doped region 142 or a second cathode layer 142. A resist pattern 124 defines an opening through which an N-type dopant 128, e.g. phosphorous or arsenic, is implanted into the semiconductor layer 120 to form the second cathode layer 142. The implant process may be a process used to form a shallow N-well of a MOS transistor in other device process flows, and may be a chain implant. At least one implant energy and dose are such that the second cathode layer 142 is formed below the first cathode layer 141 with a greater dopant concentration than in the first cathode layer 141. In an example, phosphorous is implanted using one or more implant conditions, including implanting with an energy of in a range between 300 keV and 1 MeV and a dose of in a range between about 1E13 cm$^{-2}$ and 7E13 cm$^{-2}$. The resulting dopant profile results in the second cathode layer 142 having a second carrier concentration greater than the first carrier concentration, and a maximum depth in a range between about 0.8 μm and about 2.0 μm. Together, the cathode layers 141 and 142 may be regarded as a single semiconductor layer, or cathode, 140, and may be referred to herein by either term. While the boundaries of the second cathode layer 142 and the first portion 131 of the buried layer 130 are shown as distinct boundaries, those skilled in the art will appreciate that there may be overlap between the dopant implanted into these regions without departing from the scope of the disclosure. The photoresist masks 124 are removed after the implantation step.

Figure 5:
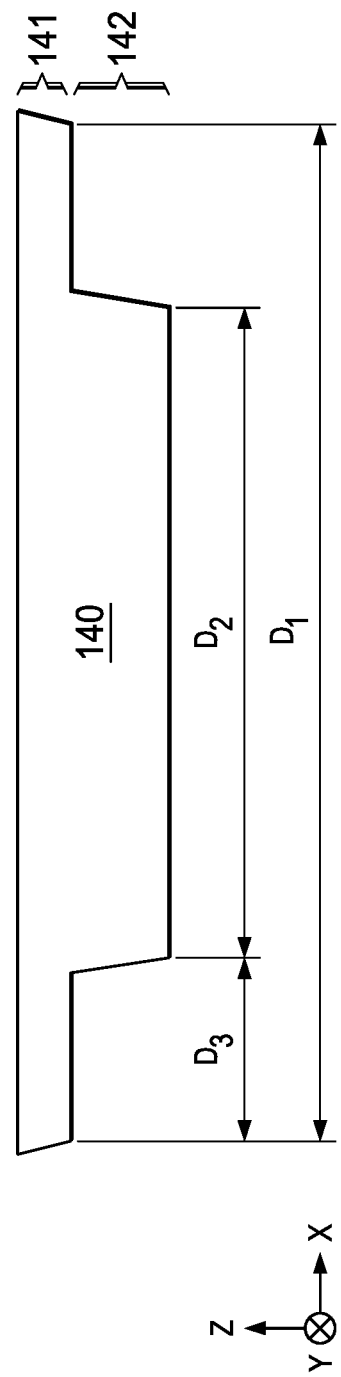

FIG. 5 illustrates aspects of the semiconductor layer 140. As described previously the first cathode layer 141 may have an out-of-plane thickness with a value within a range from about 0.8 μm to about 2.0 μm, and the second cathode layer 142 may have an out-of-plane thickness with a value within a range from about 0.5 μm to about 1.0 μm. An in-plane dimension D1 of the first cathode layer 141 is not limited to any particular value, but may have a minimum value of about 0.4 μm in various examples. D2 is smaller than D1, with an overlap D3 having a typical value in a range between about 0.5 μm and about 5 μm.

FIG. 6 illustrates the photodiode 100 after removing the photoresist mask 124. Heavily doped P-type substrate ohmic contacts 171 and heavily doped N-type contacts 175 have been formed, e.g. by conventional methods, corresponding to S806 of FIG. 8. The contacts 171 may be referred to anode contacts 171, and the contacts 175 may be referred to as cathode contacts. In some examples, the anode contacts 171 are sections of a same anode contact that surrounds the cathode 140. Similarly, in some examples the cathode contacts 175 are sections of a same cathode contact that surrounds a central portion of the cathode 140. Field plates 181 and 182 have also been formed over the isolation structure 160, e.g. by conventional methods, corresponding to S805 of FIG. 8.

With respect to FIG. 8 and formation steps otherwise described, steps or processes may be performed in any suitable order. In some examples, forming the trench isolation structure 160 in the semiconductor layer 120 may be performed before providing the semiconductor layer 120 (S801) or after forming the second cathode layer 142 (S804). In some examples, the second cathode layer 142 (S804) may be formed before the first cathode layer 141 (S803).

With continued reference to FIG. 6, the cathode 140 is shown as a single N-type region, with boundaries between the cathode 140 and the semiconductor layer 120 and between the cathode 140 and the buried layer 130 representing nominal extents of dopants defining these regions. Additional structural aspects are illustrated, including distances D4, D5 and D6. The distance D4 is between an outer extent of the cathode 140 (first cathode layer 141, FIG. 5) and a side 160A if the isolation structure 160. The distance D5 is between the side 160A and an inner extent of the cathode 140 (second cathode layer 142, FIG. 5). The sum of D4 and D5 is the overlap distance D3 between the inner and outer extents of the cathode 140. The distance D6 is the extent of overlap of the field plate 182 past the outer extent of the cathode 140. By way of example without implied limitation, D4 may have a value in a range between about 0.2 μm and 2.0 μm, D5 may have a value in a range between about 0 μm and 0.5 μm, and D6 may have a value in a range between about 0 μm and 1 μm.

FIG. 7 illustrates the photodiode 100 in a different view, showing representative extents of charge carriers in the cathode 140, the first portion 131 of the buried layer 130, and the semiconductor layer 120. The cathode 140 is shown as biased with a potential $V_k$, and the contacts 171 are shown biased with a potential $V_A$. The cathode 140 and contacts 171 may include a silicide layer to effect ohmic contact to these regions. Such silicide layers may be formed by any suitable conventional or novel method. A bias voltage $V_A-V_k$ represents the bias voltage placed between the cathode 140 and the buried layer portion 131. In the absence of any bias, $V_A-V_k=0$, a depletion region 135 forms between the cathode 140 and the buried layer portion 131 as holes diffuse from the P-type buried layer portion 131 and semiconductor layer 120 to the N-type cathode 140, and electrons diffuse in the reverse direction. The depletion region 135 is relatively narrow between the buried layer portion 131 and the N-type cathode 140 due to the higher doping levels of these regions. The depletion region 135 is relatively wider between the semiconductor layer 120 and the N-type cathode 140, especially near the surface where the N-type cathode 140 is more lightly doped. Thus, the electric field between the buried layer portion 131 and the N-type cathode 140 is higher than the electric field between the semiconductor layer 120 and the N-type cathode 140. When a reverse bias $-V_{bias}$ is placed across the anode (P-type regions) and the cathode 140, the depletion region 135 will be wider, but the relative width relationships are maintained. The lower electric field associated with those regions with a wider depletion region reduce the possibility of edge breakdown of the photodiode 100, allowing larger reverse bias voltage than would otherwise be possible. The larger reverse bias voltage in turn provides a larger avalanche amplification effect than would otherwise be possible.

As optical signals enter the photodetector 100 and photons of optical signals are absorbed, carriers 189 including electrons and holes are generated. The electric field between the N-type cathode 140 and the P-type buried layer 131 accelerates the electrons, thereby exciting additional electron-hole pairs, causing avalanche carrier multiplication in the photodetector 100 and an avalanche current in the photodetector 100.

The trench isolation structure 160 and the separation portion 123 of the semiconductor layer 120 spatially separate the contacts 171 and the second portion 132 of the buried layer 130 from the edges of the semiconductor layer 140 (e.g., the edge 145 of the second cathode layer 142 of the semiconductor layer 140). Further, because of the lower doping level of the separation portion 123 as compared to, e.g., the higher doping level of the buried layer 130, and the insulation properties of the trench isolation structure 160, the path between the contact 171 and the edge 145, and between the second portion 132 and the edge 145 may have a relatively low conductivity. Accordingly, the depletion region 135 may have a relatively high electric field, while the maintaining a relatively low electric field in the region of the edge 145. Thus avalanche carrier multiplication may be enhanced in the planar depletion region 135, while reducing effects of thermally generated dark current in the region of the edge 145.

In the example of FIG. 7, the field plates 181 and 182 are over the trench isolation structure 160. Each of the field plates 181 and 182 may form a respective continuous path that surrounds the cathode 140. The field plates 181 and 182 include poly-silicon, metal, and/or any other suitable material. In some examples, the field plate 181 is electrically connected to the anode contact 171 at the anode voltage, and the field plate 182 is electrically connected to the cathode contact 175 at the cathode voltage. The field plates 181 and 182 can shield the separation portion 123 of the semiconductor layer from external electric fields, e.g. from structures over the trench isolation structure 160, such packaging structures (not shown in FIG. 7). Further, the field plates 181 and 182 may reduce the electric field near the edges 145 of the semiconductor layer 140, and contributing to the reduction or elimination of edge breakdown.

In some examples, as illustrated in FIG. 7, the first cathode layer 141 (see FIG. 4) extends under the isolation structure 160. In such cases the semiconductor layer 140 may contribute to the spreading out of the equipotential lines of the electric field under the isolation structure 160, thereby reducing the electric field near the semiconductor surface under the isolation structure 160 and improving reliability.

In one example, the substrate 110 is at a P+ doping level (heavily doped), the semiconductor layer 120 is at a P− doping level (lightly doped), the buried layer 130 is at a P+ doping level, the semiconductor layer 140 includes sublayers at N+ doping levels, the contact 171 is at a P+ doping level, the voltage received by the contact 175 is 0 volts, and the voltage received by the contact 171 is a negative voltage. In another example, the substrate 110 is at N+ doping level, the semiconductor layer 120 is at a N− doping level, the buried layer 130 is at a N+ doping level, the semiconductor layer 140 includes sublayers at P+ doping levels, the contact 171 is at a N+ doping level, the voltage received by the contact 175 is 0 volts, and the voltage received by the contact 171 is a positive voltage. The above-described example doping levels and example voltages are merely for illustrative purposes, and are not intended to limit the scope of the present disclosure. Doping levels of structures in the photodetector 100 and voltages received by the contacts 171 and 175 may be chosen according to various application scenarios.

FIG. 9 illustrates a plan view of the photodetector 100 in FIG. 7 in a cut through the buried layer 130. The separation portion 123 of the semiconductor layer 120 is between the first portion 131 of the buried layer 130 and the second portion 132 of the buried layer 130, and has an annular shape. In the example of FIG. 9, boundaries of various features of the photodetector 100 (such as 140, 131,132, 123) have a circular or annular shape across the X-Y plane, e.g. are circular symmetric. In other examples, not shown, such features may have a stripe shape across the X-Y plane, e.g., extending along the Y axis. In such examples, the photodetector 100 may have a square or rectangular shape.

Figure 10:
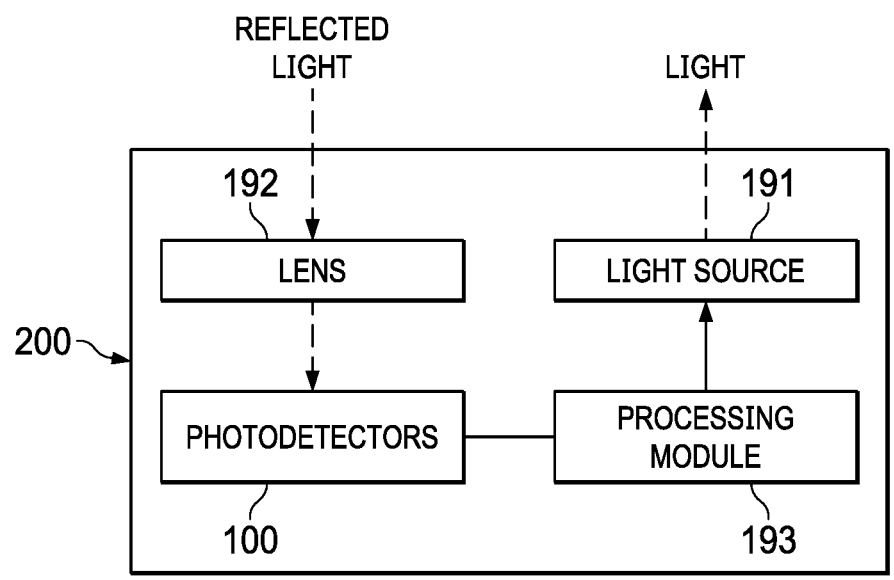
FIG. 10 illustrates a block diagram for an example optical sensing system that uses the photodiode of FIG. 7, according to described examples.

FIG. 10 shows a block diagram for an example of an optical sensing system 200 consistent with the present disclosure. The optical sensing system 200 includes a light source 191, one or more lens 192, one or more photodetectors 100, and a processing module 193 coupled to the light source 191 and the photodetectors 100. The photodetectors 100 may be arranged in one or more rows and one or more columns. The light source 191 may be a laser generator to emit laser light. The laser light generated by the light source 191 may be reflected by objects to be detected. The reflected light is focused by the lens 192 onto the photodetectors 100. The photodetectors 100 convert the light signals into electrical signals, e.g. by avalanche amplification, and provide the electrical signals to the processing module 193 for analysis. The processing module 193 can control the light source 191 and analyze the electrical signals received from the photodetectors 100 to generate a three-dimensional point cloud representing the objects from which the light is reflected.

In this description, the term "couple," "couples," or the like means either an indirect or direct wired or wireless connection. Thus, if a first device couples to a second device, that connection may be through a direct connection or through an indirect connection via other devices and connections. The term "about" refers generally to inherent manufacturing uncertainties or tolerances typical of semiconductor manufacturing, e.g. ±10% of a nominal or target value.

Modifications, additions, or omissions may be made to the systems, apparatuses, and methods described herein without departing from the scope of the disclosure. Moreover, the operations of the systems and apparatuses disclosed herein may be performed by more, fewer, or other components; and the methods described may include more, fewer, or other steps. Additionally, steps may be performed in any suitable order.

What is claimed is:

1. An integrated circuit, comprising:
a photodetector including an epitaxial layer having a first conductivity type over a substrate, the epitaxial layer having a top surface;
a buried layer of the first conductivity type located within the epitaxial layer and having a higher carrier concentration than the epitaxial layer; and
a semiconductor layer located over the buried layer, the semiconductor layer having an opposite second conductivity type and including a first sublayer within the epitaxial layer over the buried layer, and a second sublayer between the first sublayer and the buried layer, the first sublayer having a larger lateral dimension than the second sublayer in a direction parallel to the top surface and having a lower carrier concentration than the second sublayer.

2. The photodetector of claim 1, further comprising:
a dielectric isolation structure that surrounds the semiconductor layer and extends from the top surface into the first sublayer.

3. The photodetector of claim 2, wherein:
the buried layer includes a first portion and a second portion that is laterally spaced apart from the first portion, the first and second portions having a same carrier concentration; and
the epitaxial layer separates the first portion from the second portion under the dielectric isolation structure.

4. The photodetector of claim 2, wherein the dielectric isolation structure includes silicon dioxide.

5. The photodetector of claim 2, wherein the isolation structure has a smaller depth than the first sublayer.

6. The photodetector of claim 1, wherein the first and second sublayers are circular-symmetric.

7. The photodetector of claim 2, further comprising first and second conductive field plates located over the dielectric isolation structure and laterally surrounding the second sublayer, the first conductive field plate conductively isolated from the second conducive field plate.

8. The photodetector of claim 7, wherein:
the first field plate is conductively connected to the first sublayer.

9. The photodetector of claim 8, wherein a gap between the first and second field plates is located over a portion of the epitaxial layer that touches the dielectric isolation structure.

10. The photodetector of claim 1, wherein the epitaxial layer is p-type and the semiconductor layer is n-type.

11. An optical sensing system, comprising:
a photodetector including:
an epitaxial layer having a first conductivity type over a substrate, the epitaxial layer having a top surface;
a buried layer of the first conductivity type located within the epitaxial layer and having a higher carrier concentration than the epitaxial layer; and
a semiconductor layer within the epitaxial layer and located over the buried layer, the semiconductor layer having an opposite second conductivity type and including a first sublayer over the buried layer and a second sublayer between the first sublayer and the buried layer, the first sublayer having a larger lateral dimension than the second sublayer in a direction parallel to the top surface and having a lower carrier concentration than the second sublayer;
a lens configured to focus an optical signal over the photodetector; and
a processing module coupled to the photodetector and configured to perform post-acquisition processing of the optical signal, the post-acquisition processing including determining a point in space of an object from which the optical signal emanates.

12. The system of claim 11, further comprising a dielectric isolation structure that surrounds the semiconductor layer and touches the epitaxial layer and the first sublayer.

13. The system of claim 12, wherein the photodetector further includes first and second field plates over the dielectric isolation structure, the first field plate conductively connected to the semiconductor layer and the second field plate conductively connected to the buried layer.

14. A method of forming an integrated circuit, comprising:
   forming a p-type buried layer located within a p-type epitaxial layer, the buried layer having a higher carrier concentration than the epitaxial layer; and
   forming an n-type semiconductor layer located over the buried layer and having, the semiconductor layer including a first sublayer within the epitaxial layer and over the buried layer and a second sublayer between the first sublayer and the buried layer, the first sublayer having a larger lateral dimension than the second sublayer in a direction parallel to a top surface of the epitaxial layer and having a lower carrier concentration than the second sublayer.

15. The method of claim 14, further comprising:
   forming a dielectric isolation structure that surrounds the semiconductor layer and extends from the top surface into the first sublayer;
   forming first and second conductive field plates over the dielectric isolation structure, the field plates laterally surrounding the first sublayer; and
   connecting the first field plate conductively to the first sublayer and the connecting the second field plate conductively to the second sublayer.

16. The method of claim 15, wherein:
   the buried layer includes a first portion and a second portion that is laterally spaced apart from the first portion, the first and second portions having a same carrier concentration; and
   the epitaxial layer separates the first portion from the second portion under the dielectric isolation structure.

17. The method of claim 15, wherein the isolation structure has a smaller depth than the first sublayer.

18. A photodetector, comprising:
   an epitaxial layer having a first conductivity type over a semiconductor substrate, the epitaxial layer having a top surface;
   a buried layer of the first conductivity type located within the epitaxial layer and having a higher carrier concentration than the epitaxial layer;
   a semiconductor layer located over the buried layer, the semiconductor layer having an opposite second conductivity type including a first sublayer within the epitaxial layer and a second sublayer between the first sublayer and the buried layer, the first sublayer laterally extending past the second sublayer; and
   a dielectric isolation structure that extends from the top surface into the first sublayer and has a thickness less than that of the first sublayer.

19. The photodetector of claim 18, wherein the dielectric isolation structure is directly over a lateral gap between a first portion of the buried layer and a second portion of the buried layer.

20. The photodetector of claim 19, further comprising:
   an anode contact within the epitaxial layer and a cathode contact within the first sublayer; and
   a first field plate located over the dielectric isolation structure and electrically connected to the anode contact, the first field plate surrounding a second field plate located over the dielectric isolation structure and electrically connection to the cathode contact.

* * * * *